United States Patent [19]
Esfahani

[11] Patent Number: 5,479,440
[45] Date of Patent: Dec. 26, 1995

[54] APPARATUS AND METHOD FOR IMPULSIVE NOISE CANCELLATION

[75] Inventor: Farhad Esfahani, Duncan, Okla.

[73] Assignee: Gas Research Institute, Chicago, Ill.

[21] Appl. No.: 228,153

[22] Filed: Apr. 15, 1994

[51] Int. Cl.$^6$ .............................. H03D 1/04; G06F 17/14
[52] U.S. Cl. ............................................. 375/346; 364/726
[58] Field of Search ...................... 375/1, 34, 58, 375/99; 364/725, 726, 485, 486; 348/14, 17, 400, 403; 358/432

[56] References Cited

U.S. PATENT DOCUMENTS

| | | | |
|---|---|---|---|
| 3,668,702 | 6/1972 | Jones | 342/91 |
| 4,516,249 | 5/1985 | Cook et al. | 364/726 |
| 4,899,289 | 2/1990 | Appel | 364/484 |
| 5,065,322 | 11/1991 | Mazur et al. | 364/726 |
| 5,157,394 | 10/1992 | Bright | 364/726 |
| 5,229,765 | 7/1993 | Gardner | 340/853.2 |
| 5,263,048 | 11/1993 | Wade | 375/99 |

Primary Examiner—Young Tse
Attorney, Agent, or Firm—Dick and Harris

[57] ABSTRACT

The present invention comprises an apparatus and method for substantially canceling impulsive noise from data. Such substantial cancellation is achieved by converting the time-domain data into its corresponding frequency spectrum, such that the impulsive noise threshold can be determined. Once such threshold is determined, all frequency components less than this threshold are canceled with the resulting spectrum being converted back to the time-domain. This substantially impulse free signal can then be substituted into the original signal where the impulsive noise occurs, thus, resulting in a signal having minimally distorted data that is substantially devoid of any impulsive noise. This signal may be further processed by an adaptive filter stage to substantially remove any remaining noise from the signal.

12 Claims, 2 Drawing Sheets

APPARATUS AND METHOD FOR IMPULSIVE NOISE CANCELLATION

BACKGROUND OF THE INVENTION

1. Field of the Invention

The present invention relates in general to electronic signal processing and, in particular, to an apparatus and method for substantially canceling impulsive noise from various data sets. The disclosed apparatus and method has substantial utility in gas and oil exploration where electromagnetic borehole telemetry (EBT) signals are utilized in determining geophysical attributes of the land surrounding the particular wellhole.

2. Background Art

As with any signal processing, EBT signals unavoidably contain unwanted noise. Most of this unwanted noise varies with time and location due to varying surface conditions and the lithology of the areas of operation. Much of this noise has been removed through the use of adaptive filtering. One particular type of adaptive filtering utilizes a least mean square gradient search to adjust filter parameters toward cancellation of the unwanted noise.

While adaptive filters generally perform well where the processed signal is relatively undisturbed (i.e. contains much of the spectrum), these filters are incapable of removing impulsive noise. Impulsive noise can be thought of as power spikes of relatively infinitesimal duration. As such, this impulsive noise tends to be spread across the spectrum resulting in a noise floor above which the real data must use. This results in a lower signal-to-noise ratio, which is undesirable.

It has been known in the prior art that these impulsive noises must be removed prior to the adaptive filtering stage. One approach has used median filters. Median filters run a sliding window over the data and at each step filter the data by replacing the point in the middle of the window by the median of the points inside the window. For example, if one uses a three point window and the values inside are 12, 5 and 30, the value 5 is replaced by 12, which is the median value of the three points. For high sample rate data, the median filter works well, without introducing much distortion to data. For low sample rate cases, the median filter can introduce significant unwanted distortion. The distortion is large due to the small number of samples present per cycle of the sine wave. For any given change in time, the change in magnitude would then be large. The peak points look like spikes to the median filter and are flattened. This type of distortion is highly undesirable when one considers the large error values relative to the very small signals of interest that can be over 60 db below the noise amplitude.

Another possible filtering method with smaller total error is one in which the data is scanned and only changed if impulses are detected. The impulse data are replaced by a piecewise-linear estimated value calculated using two previous data points. Even though this method reduces the total error, it still does not result in acceptable estimates for the noisy data points.

An ideal filter for impulsive noise removal is one that removes only the impulses and that will not distort any other data points. After the impulses have been removed, they must be replaced by suitable values. Different types of estimators can be used for this purpose. For example, the new value may be set to the previous value, the median (using a conditional median filter, for instance) or a piecewise linear estimate. These methods may be useful for high sample rate data however, for low sample rates, other methods that minimize the estimation error are needed.

SUMMARY OF THE INVENTION

In a preferred embodiment, the noise cancellation system comprises an anti-aliasing filter stage; analog-to-digital converter; a signal processor; and an adaptive filter stage. Where the source signal is analog it is fed into an anti-aliasing filter for filtering out the portion of the signal greater than one-half the rate at which the analog-to-digital converter will convert that signal into a time-domain digital signal. This processed digital signal is then fed into the signal processor.

In a preferred embodiment, the signal processor processes the time-domain digital signals through a number of operations to substantially cancel any impulsive noise found within the signal. In this embodiment, the signal processor includes means for converting the time-domain digital signal into its corresponding frequency domain spectrum. Once in the frequency domain, the signal processor determines the impulsive noise threshold of the corresponding frequency domain spectrum for the particular set of data. Once such impulsive noise threshold is established, the signal processor replaces the frequency components that fall below the impulsive noise threshold with zero values, resulting in a modified frequency spectrum. This modified frequency spectrum is then converted back into the time-domain. In one embodiment, this signal may be further processed by an adaptive filtering stage to substantially remove remaining noise toward analysis of such signals.

In a preferred embodiment, during the processing of the digital signal in the frequency domain, another copy of the original time-domain digital signal is delayed through delay means such that the time-domain digital signal and modified time-domain digital signal—as it is output by the signal processor—correspond in time. This delayed version of the original time-domain digital signal is fed into detecting means that detects portions of the original time-domain digital signal containing impulsive noise. In this embodiment, when, and if, such impulsive noise is located, the portion of the time-domain digital signal containing the impulsive noise is replaced with the corresponding portion of the modified time-domain digital signal produced by the frequency domain processing.

In one embodiment, the resulting signal is then fed into an adaptive filter stage for substantially removing any remaining noise resulting in a substantially true set of digital data which may be analyzed.

In its most prevalent environment, the present invention may be utilized for substantially canceling noise from electromagnetic borehole telemetry signals. These electromagnetic borehole telemetry signals are obtained from a signal receiver that receives geophysical data due to the transmissions of a low frequency transmitter located within the borehole. While these signals originate from wellbore recorders, such data may be initially recorded by recording means, such as magnetic media, for later processing and analysis. In a preferred embodiment of the invention, where the data is obtained directly from the wellbore for real-time processing, the processing means comprises a digital signal processor. In another embodiment, wherein the data need not be processed in real-time, the processing means may comprise a microcomputer, personal computer or like device, having less processing power than standard digital signal processors.

A preferred embodiment of the invention further includes a method for substantially canceling impulsive noise from a time-domain digital signal. The method comprises the steps of (a) converting the time-domain digital signal into a corresponding frequency spectrum; (b) determining an impulsive noise threshold for the corresponding frequency spectrum; (c) replacing frequency components within the corresponding frequency spectrum which are less than the determined impulsive noise threshold with zero values, resulting in a modified frequency spectrum; and (d) converting the modified frequency spectrum into a modified time-domain digital signal.

In another embodiment, the method further includes the steps of (e) detecting a portion of the time-domain digital signal containing impulsive noise; and (f) substituting the portion of the time-domain digital signal containing the impulsive noise with a portion, corresponding in time, of the modified time-domain digital signal.

BEST MODE OF THE INVENTION

Figure 1:
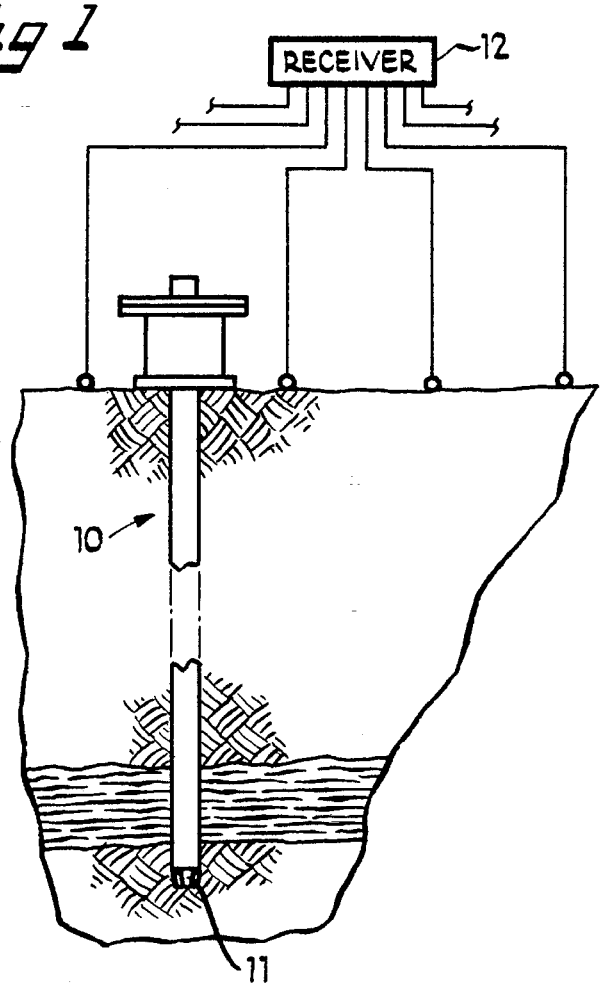
FIG. 1 of the drawings is a depiction of one potential environment—oil and gas exploration—in which the present impulsive noise cancellation apparatus and method has utility.

While this invention is susceptible of embodiment in many different forms, there is shown in the drawings and will herein be described in detail, one specific embodiment with the understanding that the present disclosure is to be considered as an exemplification of the principles of the invention and is not intended to limit the invention to the embodiment illustrated.

The present invention comprises an apparatus and method for processing time-domain digital signals toward minimizing the presence of noise, including impulsive noise, in those signals. One potential environment for such an apparatus and method is in oil and gas exploration.

FIG. 1 of the drawings depicts one particular means of obtaining oil and gas exploration data—electromagnetic borehole telemetry. Electromagnetic borehole telemetry involves placing transmitter 11 within borehole 10. Transmitter 11 emits low frequency signals in the extremely low frequency range (on the order of less than 100 Hz). Electromagnetic borehole telemetry (EBT) signals must be analyzed for long time intervals to obtain a complete determination of the subject geophysical attributes. Although a large time interval is required, by limiting the sampling rate at which digitalization occurs, the number of data points are limited to allow for real-time signal processing. These EBT signals are received through the geophysical formations surrounding borehole 10 by receiver 12, located on the surface. As with any signal analysis, it is desirable to increase the signal-to-noise ratio of the electromagnetic borehole telemetry (EBT) data obtained by receiver 12 to insure proper analysis of the obtained data.

Inasmuch as minimization of background noise within a desired signal is desirable in most, if not all, signal processing applications, it can be seen that the apparatus and method disclosed hereinbelow has utility beyond oil and gas exploration, including, but not limited to, radar, imaging and other signal processing applications.

Figure 2:
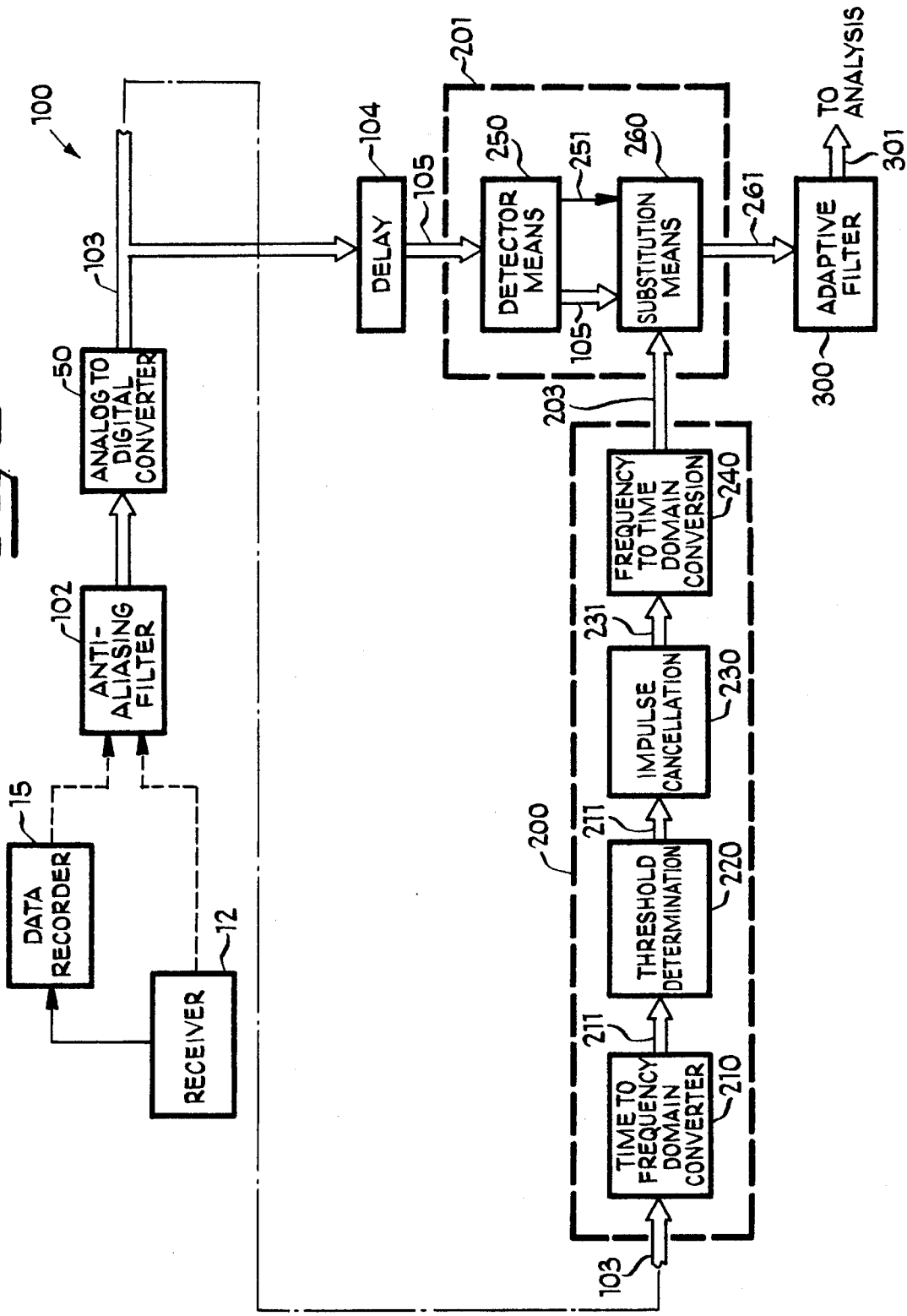
FIG. 2 of the drawings is a block diagram of the present apparatus.

Noise cancellation apparatus 100 serves to substantially cancel noise from various time-domain signals. FIG. 2 of the drawings is a block diagram of one particular embodiment of noise cancellation apparatus 100. In this embodiment, digital signal—a time domain signal—is introduced, in series or parallel, into apparatus 100. Where the desired signal is analog, it is filtered through anti-aliasing filter 102, which filters out frequencies above one-half the sampling rate of analog-to-digital converter means 50 to prevent aliasing in the digitized signal. Analog-to-digital converter means 50 digitizes the analog signal outputting filtered digital signal 103.

Figure 3:
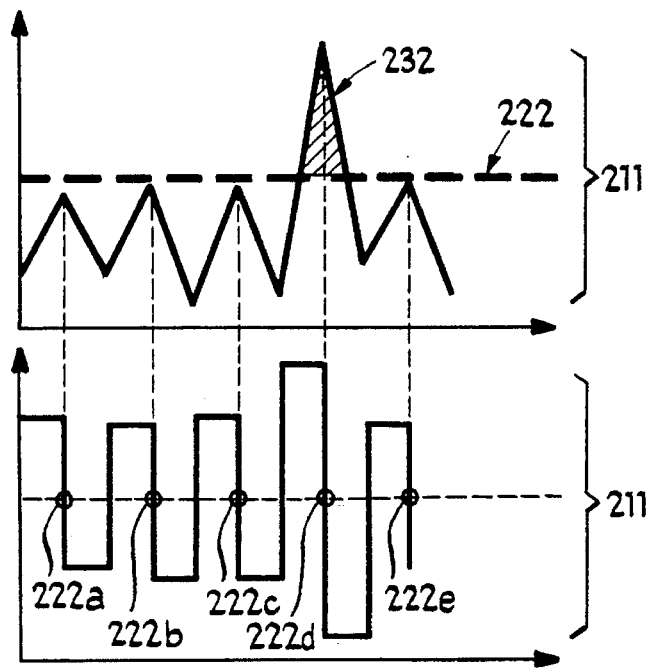
FIG. 3 of the drawings is a graphical depiction of the process involved in determining the impulsive noise threshold from the frequency spectrum.

Filtered digital signal 103 is operably accepted by processing means 200. Processing means 200 serves to substantially cancel any impulsive noise contained within filtered digital signal 103. Processing means 200 comprises converting means 210, threshold determination means 220, impulse cancellation means 230 and converting means 240. Converting means 210 converts filtered digital signal 103 from the time-domain into a corresponding frequency domain spectrum 211. FIG. 3 is a graphical representation of one particular frequency domain spectrum 211. This particular frequency spectrum has been fabricated merely to assist in the exemplification of the present invention.

While in a preferred embodiment this time-to-frequency domain conversion is performed utilizing the Cooley-Tukey Fast Fourier Transform (FFT) algorithm, any time-to-frequency domain conversion technique, such as, other FFT algorithms (both decimation-in-time and decimation-in-frequency), fourier transform algorithms, cosine transform algorithms and chirp-Z transform algorithms, among others, may be utilized for this conversion. Utilizing a FFT within a digital signal processor, such as the DSP 32c sold by AT&T, should allow for real-time signal processing. Other time-to-frequency conversion algorithms may make real-time evaluation of the signals substantially impossible. Additionally, use of slower processing devices, such as a personal computer could increase the time required for processing.

However, for certain environments and uses, real-time-processing is not a requisite. In such cases, apparatus 100 would additionally include data recording means 15. Data recording means 15 records the electromagnetic borehole telemetry signals obtained from signal receiver 12 for later processing and potential reprocessing. Data recording means 15 may comprise semiconductor memory, disk drives and disks, audio recording equipment and any other devices capable of receiving and recording analog and/or digital electronic signals for later playback.

The output of conversion means 210 is operably accepted by threshold determination means 220. Threshold determination means 220 utilizes frequency domain spectrum 211 to locate the impulsive noise, which would have been difficult to analyze in the time-domain (given the infinitesimal duration of impulsive noise). In one potential embodiment, threshold determination involves obtaining frequency spectrum derivative 221 (shown in FIG. 3) from frequency spectrum 211, such that the frequency peaks, Xman, appear as negative-going zero crossings 222a, 222b, 222c, 222d and 222e. Once these zero crossings are located the threshold can be calculated as follows:

$$\text{Threshold} = \frac{1}{N} \sum_{i=0}^{N} X_{max}(i)$$

where N is the number of frequency peaks detected in frequency spectrum 211 (or zero-crossings in frequency spectrum derivative 221)—5 for the example presented in FIG. 3. The resulting threshold 222 is depicted for the data shown in FIG. 3.

In another embodiment, threshold determination involves utilization of a recursive median filter (RMF) over the magnitudes of frequency spectrum 211, using the foregoing equation:

$$Y(i) = \text{MED}\left(Y\left(i - \frac{L-1}{2}\right), \ldots, Y(i-1), X(i), \ldots, X\left(i + \left(\frac{L-1}{2}\right)\right)\right)$$

where Y (i) is the value of the recursive median filter at the i'th data position, MED ( ) is the median operator and L is the length (an odd number) of the sliding window within which the median value is determined. As can be seen, each calculation of median value is dependent on both new input values and previous filter outputs, hence the name recursive median filter.

Impulse cancellation means 230 replaces frequency components within corresponding frequency spectrum 211 which are less than impulsive noise threshold 222 as determined by determining means 220 with zero values, resulting in modified frequency spectrum 231. As viewed on the graph of FIG. 3, shaded portion 232 of corresponding frequency spectrum 211 is zeroed-out, thus removing the impulsive noise. The resulting modified frequency spectrum is then converted by converting means 240 back into the time-domain resulting in modified time-domain digital signal 203, which is substantially devoid of impulsive noise.

Converting means 240 is substantially the inverse of converting means 210. This is to say that where converting means 210 comprises the Cooley-Tukey FFT algorithm, as in a preferred embodiment, converting means 240 comprises an inverse Cooley-Tukey FFT algorithm. The same holds true where converting means 210 comprises other FFT algorithms (both decimation-in-time and decimation-in-frequency), fourier transform algorithms, cosine transform algorithms, chirp-Z transform algorithms and others. Converting means 240 may additionally provide for complex-to-real conversion inasmuch as imaginary components may appear in modified time-domain digital signal 203. A preferred approach to the complex-to-real conversion is to merely ignore such imaginary components as insignificant—a reasonable approximation for EBT data.

In one embodiment, modified time-domain digital signal 203 is operably connected to adaptive filter stage 300 which serves to substantially cancel remaining noise before analysis— as described further hereinbelow. However, because some desired signal frequency components may have fallen below impulsive noise threshold 222, modified time-domain digital signal 203 may contain significant errors relative to the nature of the desired data set. This is potentially the case for EBT data where the desired signal amplitudes are very small compared to the noise. Thus, a preferred embodiment further includes delay means 104 and post-processing stage 201.

Delay means 104 serves to delay filtered digital signal 103. Post-processing stage 201 is operably connected to delay means 104 and processing means 200. Processing means 200 provides modified time-domain digital signal 203 as a reference signal derived from filtered digital signal 103. Post-processing stage 201 relies upon the availability of "time-synchronized" versions of modified time-domain digital signal 203 and filtered digital signal 103. To this end, delay means 104 delays filtered digital signal 103 for the same amount of time as is required to process the same signal in processing means 200. For instance, where processing means 200 comprises the DSP32c programmable digital signal processor from AT&T, this delay is on the order of 10 milliseconds. Thus, delayed digital signal 105 and modified time-domain digital signal 203 correspond in time as they are input into post-processing stage 201.

Post-processing stage 201 comprises detector means 250 and substitution means 260. Detector means 250 operably receives delayed digital signal 105 and detects the portions of this time-domain signal that contain impulsive noise. Impulsive noise is detected by determining whether the slope between two adjacent data points within filtered digital signal 103 exceeds a maximum slope. This maximum slope is calculated as:

$$\text{Slope}_{max} = \frac{ND_{rms}}{\Delta t}$$

where N is an integer from 1 to 3, delta(t) is the sampling period, and Dems is the root mean square of the data set. When the slope of adjacent points exceeds this maximum, substitution is required. Such that when portions containing impulsive noise are detected, detector means 250 directs substitution means 260, through substitution signal 251 to replace the current value of delayed digital signal 105 with the value of modified time-domain digital signal 203, thus, resulting in intermediate digital signal 261. Intermediate digital signal 261 retaining the desirable data yet being substantially free of undesirable impulsive noise.

In this preferred embodiment, intermediate digital signal 261 is operably connected to adaptive filter stage 300. Adaptive filter stage 300 substantially removes any remaining noise remaining in intermediate digital signal 261 resulting in a substantially true set of digital data which may be analyzed. In the preferred embodiment, adaptive filter stage 300 comprises a Least Mean Square function which is used to compare intermediate digital signal 261 to noise reference signal 301—obtained from the surface adjacent the borehole (see FIG. 1). Reference signal 301 contains the remaining noise to be factored out by adaptive filter stage 300. The resulting output of adaptive filter stage 300 is then analyzed or saved for later analysis.

In operation, noise cancellation apparatus 100 performs a number of actions toward substantially canceling impulsive, as well as other, noise from a time-domain digital signal. First, the time-domain digital signal is converted into a corresponding frequency spectrum in converting means 210. Next, the impulsive noise threshold is determined by threshold determination means 220 for the corresponding frequency spectrum produced by converting means 210. Once this impulsive noise threshold has been determined (one such determination being shown in FIG. 3), the frequency components within the corresponding frequency spectrum which are less than the determined impulsive noise threshold are replaced with zero values, resulting in a modified frequency spectrum. This modified frequency spectrum is then converted into a modified time-domain digital signal. This conversion back to the time-domain is the inverse of the conversion to the frequency spectrum.

While the resulting modified time-domain digital signal could potentially being further processed in an adaptive filter stage to remove remaining noise, for some data sets—such as EBT data—the processing may have additionally cancelled some frequency components of the desired signal. Therefore, in a preferred approach, the apparatus further detects a portion of the original time-domain digital signal containing impulsive noise. Where such impulsive noise is located, the apparatus substitutes that portion of the time-domain digital signal containing the impulsive noise with a portion, corresponding in time, of the modified time-domain digital signal generated by processing means 200. The resulting intermediate signal is then operably accepted by adaptive filtering stage 300 for further processing and later analysis.

The foregoing description and drawings merely explain and illustrate the invention and the invention is not limited thereto except insofar as the appended claims are so limited as those skilled in the art who have the disclosure before them will be able to make modifications and variations therein without departing from the scope of the invention.

What is claimed is:

1. An apparatus for processing a time-domain digital signal toward minimizing the presence of impulsive noise in the time-domain digital signal, the processing apparatus comprising:

first means for converting the time-domain digital signal into a corresponding frequency domain spectrum;

means for determining an impulsive noise threshold, said impulsive noise threshold being mathematically related to the corresponding frequency domain spectrum established by the first converting means;

means for replacing only those frequency components within the corresponding frequency domain spectrum which are less than the impulsive noise threshold, as determined by the determining means, with zero values, resulting in a modified frequency domain spectrum; and second means for converting the modified frequency domain spectrum into a modified time-domain digital signal wherein the modified time-domain digital signal is substantially devoid of impulsive noise.

2. The apparatus according to claim 1 wherein the first converting means comprises a fast Fourier transform and the second converting means comprises an inverse fast Fourier transform.

3. The apparatus according to claim 1 wherein the first converting means comprises a cosine transform and the second converting means comprises an inverse cosine transform.

4. An apparatus for processing a time-domain digital signal toward minimizing the presence of impulsive noise in the time domain digital signal, the processing apparatus comprising:

first means for converting the time-domain digital signal into a corresponding frequency domain spectrum;

means for determining an impulsive noise threshold of the corresponding frequency domain spectrum established by the first converting means;

means for replacing frequency components within the corresponding frequency domain spectrum which are less than the impulsive noise threshold as determined by the determining means with zero values, resulting in a modified frequency domain spectrum;

second means for converting the modified frequency domain spectrum into a modified time-domain digital signal wherein the modified time-domain digital signal is substantially devoid of impulsive noise;

means for detecting a portion of the time-domain digital signal containing impulsive noise; and means for substituting the portion of the time-domain digital signal containing the impulsive noise with a portion, corresponding in time, of the modified time-domain digital signal produced by the second converting means.

5. The apparatus according to claim 4 wherein the processing apparatus further comprises:

means for delaying the time-domain digital signal such that the time-domain digital signal and modified time-domain digital signal correspond in time to facilitate the substituting means.

6. A system for substantially cancelling noise from electromagnetic borehole telemetry signals, these electromagnetic borehole telemetry signals are obtained from a signal receiver that receives geophysical data due to the transmissions of a low frequency transmitter located within the borehole, the noise cancellation system comprising:

an anti-aliasing filter operably receiving the electromagnetic borehole telemetry signals;

first means for converting the filtered electromagnetic borehole telemetry signals into time-domain digital signals;

means for processing the time-domain digital signals operably connected to an output of the first converting means, the processing means including:

second means for converting the time-domain digital signal into a corresponding frequency domain spectrum, means for determining an impulsive noise threshold of the corresponding frequency domain spectrum established by the second converting means, means for replacing frequency components within the corresponding frequency domain spectrum which are less than the impulsive noise threshold as determined by the determining means with zero values, resulting in a modified frequency domain spectrum, third means for converting the modified frequency domain spectrum into a modified time-domain digital signal wherein the modified time-domain digital signal is substantially devoid of impulsive noise, means for delaying the time-domain digital signal such that the time-domain digital signal and modified time-domain digital signal correspond in time, means for detecting a portion of the delayed time-domain digital signal containing impulsive noise, means for substituting the portion of the delayed time-domain digital signal containing the impulsive noise with a portion, corresponding in time, of the modified time-domain digital signal produced by the third converting means, and an adaptive filter stage for substantially removing any remaining noise operably connected to an output of the substituting means resulting in a substantially true set of digital electromagnetic borehole telemetry data which may be analyzed to determine the geophysical attributes of the area surrounding the borehole.

7. The system according to claim 6 wherein the noise cancellation system further comprises:

means for recording the electromagnetic borehole telemetry signals obtained from the signal receiver whereby the electromagnetic borehole telemetry signals may be recorded for later processing by the first converter means, anti-aliasing filter, processing means and adaptive filter stage.

8. The system according to claim 7 wherein the processing means comprises a microcomputer.

9. The system according to claim 7 wherein the processing means comprises a digital signal processor.

10. The system according to claim 6 wherein the processing means comprises a digital signal processor.

11. A method for substantially cancelling impulsive noise from a time-domain digital signal, comprising the steps of:

converting the time-domain digital signal into a corresponding frequency domain spectrum;

determining an impulsive noise threshold for the corresponding frequency domain spectrum;

replacing frequency components within the corresponding frequency domain spectrum which are less than the determined impulsive noise threshold with zero values, resulting in a modified frequency domain spectrum; and converting the modified frequency domain spectrum into a modified time-domain digital signal.

12. The method according to claim 11 wherein the impulsive noise cancellation method further includes the steps of:

detecting a portion of the time-domain digital signal containing impulsive noise; and substituting the portion of the time-domain digital signal containing the impulsive noise with a portion, corresponding in time, of the modified time-domain digital signal.

\* \* \* \* \*